US011239322B2

(12) United States Patent
Kikuchi et al.

(10) Patent No.: US 11,239,322 B2
(45) Date of Patent: Feb. 1, 2022

(54) P-TYPE OXIDE SEMICONDUCTOR AND SEMICONDUCTOR DEVICE HAVING PYROCHLORE STRUCTURE

(71) Applicant: National Institute of Advanced Industrial Science and Technology, Tokyo (JP)

(72) Inventors: Naoto Kikuchi, Ibaraki (JP); Yoshihiro Aiura, Ibaraki (JP); Akane Samizo, Ibaraki (JP); Shintarou Ikeda, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 258 days.

(21) Appl. No.: 16/487,993

(22) PCT Filed: Jan. 22, 2018

(86) PCT No.: PCT/JP2018/001728
§ 371 (c)(1),
(2) Date: Aug. 22, 2019

(87) PCT Pub. No.: WO2018/155033
PCT Pub. Date: Aug. 30, 2018

(65) Prior Publication Data
US 2020/0027955 A1 Jan. 23, 2020

(30) Foreign Application Priority Data
Feb. 23, 2017 (JP) .............................. JP2017-032112

(51) Int. Cl.
*H01L 29/00* (2006.01)
*H01L 29/22* (2006.01)
*H01L 29/04* (2006.01)
*H01L 29/786* (2006.01)

(52) U.S. Cl.
CPC .............. *H01L 29/22* (2013.01); *H01L 29/04* (2013.01); *H01L 29/7869* (2013.01)

(58) Field of Classification Search
CPC ..... H01L 29/22; H01L 29/04; H01L 29/7869; C01G 19/006; C01G 19/02; C01G 33/00; C01G 33/006; C01G 35/00; C01G 35/006
See application file for complete search history.

(56) References Cited

U.S. PATENT DOCUMENTS

| 4,548,741 A | 10/1985 | Hormadaly |
| 4,707,346 A | 11/1987 | Hormadaly |
| 2003/0144140 A1 | 7/2003 | Matsuo et al. |
| 2016/0218223 A1 | 7/2016 | Nomura |
| 2018/0305219 A1* | 10/2018 | Kikuchi ................. C01G 33/00 |
| 2020/0035792 A1* | 1/2020 | Kikuchi ................. H01L 29/786 |

FOREIGN PATENT DOCUMENTS

| JP | S58219703 A | 12/1983 |
| JP | 2003117407 A | 4/2003 |
| JP | 2004344733 A | 12/2004 |
| JP | 2006088019 A | 4/2006 |
| WO | 2005052067 A1 | 6/2005 |
| WO | 2010010802 A1 | 1/2010 |
| WO | WO 2017/069022 | * 4/2017 |

OTHER PUBLICATIONS

Yasuhiro Hosogi et al., "Role of Sn in Band Structure of SnMO and SnMO(M = Nb and Ta) and Their Photocatalytic Properties," Chemistry of Materials 20, 1299 (2008).
M. A. Subramanian et al., "Oxide Pyrochlores—A Review," Progress in Solid State Chemistry 15, 55 (1983).
David J. Stewart et al., "Pyrochlores. IX. Partially Oxidized Sn2Nb20, and Sn,Ta,O,:A Mossbauer Study of Sn(I1,IV) Compounds," Canadian J. Chemistry 51, 1041-1049 (1973).
T. Birchall et al., "Nonstoichiometric Phases in the Sn—Nb—0 and Sn—Ta—0 Systems Having Pyrochlore-Related Structures," J. Solid State Chemistry 13, 118-130 (1975).
Yasuhiro Hosogi et al., "Energy Structure and Photocatalytic Activity of Niobates and Tantalates Containing Sn(ll) with a 5s2 Electron Configuration," Chemistry Letters 33, 28 (2004).
Masao Kita et al., "Synthesis of novel cation-ordered compounds with fluorite-related structure prepared by oxidation of Sn—Ta—O pyrochlore," Journal of Solid State Chemistry 178, 1254-1261 (2005).
Masao Kita et al., "α-PbO2-related phase appearing in the SnIV-Ta-0 system transformed from cation-ordered fluorite-related phase," Journal of the Ceramic Society of Japan, 2014, vol. 122, No. 10, pp. 902-907.
Shota Katayama et al., "Epitaxial growth of tin(II) niobate with pyrochlore structure,""Journal of Crystal Growth", 2015, vol. 416, pp. 126-129.
International Search Report for Serial No. PCT/JP2018/001728 dated Mar. 13, 2018.
"Synthesis and characterization of Sn2+ oxides with the pyrochlore structure" by Hiroshi Mizoguchi et al., ScienceDirect, Materials Research Bulletin 43 (2008), pp. 1943-1948.

(Continued)

*Primary Examiner* — Steven J Bos
(74) *Attorney, Agent, or Firm* — McCormick, Paulding & Huber PLLC (57) ABSTRACT

Provided are an oxide semiconductor excellent in transparency, mobility, and weatherability, etc., and a semiconductor device having the oxide semiconductor, a p-type semiconductor being realizable in the oxide semiconductor. The oxide semiconductor consists of a composite oxide, which has a crystal structure including a pyrochlore structure, containing at least one or more kinds of elements selected from Nb and Ta, and containing Sn element, and its holes become charge carriers by the condition that $Sn^{4+}/(Sn^{2+}+Sn^{4+})$ which is a ratio of $Sn^{4+}$ to a total amount of Sn in the composite oxide is $0.124 \leq Sn^{4+}/(Sn^{2+}+Sn^{4+}) \leq 0.148$.

20 Claims, 8 Drawing Sheets

(56) References Cited

OTHER PUBLICATIONS

"The Crystal Structure of Foordite" by T. Scott Ercit et al., The Canadian Mineralogist, vol. 26, pp. 899-903 (1988).

"Foordite SnNb2O6, A New Mineral Species, and the Foordite-Thoreaulite Series" by Petr Cerny et al., The Canadian Mineralogist, vol. 26, pp. 889-898 (1988).

"Synthesis and Characterization of Tin Niobates" by L. P. Cruz et al., Journal of Solid State Chemistry 156, pp. 349-354 (2001).

"Pyrochlore-type tin niobate" by L. P. Cruz et al., Acta Crystallographica Section C, Crystal Structure Communications, vol. 57, Part 9, Sep. 2001, pp. 1001-1003.

International Search Report for Serial No. PCT/JP2018/001729 dated Mar. 20, 2018.

Nobuyuki Taira et al., "Photocataiytic activity of Sn2Nb2O7 (M = Nb and Ta) pyrochiore oxides with blue LEDs irradiation", published in Ceramic Society of Japan. Journal, vol. 120, No. 1407, Jan. 1, 2012 (Jan. 1, 2012), pp. 551-553.

Takahisa Omata et al., "Characterization of novel cation-ordered compounds with fluorite and α-PbO2 related structures prepared by oxidation of Sn—Nb—0 pyrochlore", published in Journal of Physics and Chemistry of Solids, Pergamon Press, London, GB, vol. 66, No. 1, Nov. 23, 2004 (Nov. 23, 2004), pp. 53-62.

Takahisa Omata et al., "Synthesis of novel compounds with cation ordered fluorite and α -PbO2 related structures by oxidation of Sn2Nb2O7 pyrochlore", published in Journal of Alloys and Compounds, Elsevier Sequoia, Lausanne, CH, vol. 370, No. 1-2, May 12, 2004 (May 12, 2004), pp. 80-89.

European Search Report for Serial No. 18756662.5 dated Nov. 23, 2020.

Oleg I. Velikokhatnyi et al., "Exploring tin tantalates and niobates as prospective catalyst supports for water electrolysis", Physica B: Condensed Matter, Elsevier, Amsterdam, NL, vol. 404, No. 12-13, Jun. 1, 2009 (Jun. 1, 2009), pp. 1737-1745; retrieved on Feb. 25, 2009.

Oleg I. Velikokhatnyi et al., "Ab Initio Study of Doped Tin Niobates and Tantalates as Prospective Catalyst Supports for Water Electrolysis", ECS Transactions, Jan. 1, 2010 (Jan. 1, 2010), pp. 37-48.

Zhengyuan Zhang et al., "Construction of SnNb2O6 nanosheet/g-C3N4 nanosheet two-dimensional heterostructures with improved photocataiytic activity: Synergistic effect and mechanism insight", Applied Catalysis B: Environmental, Elsevier, Amsterdam, vol. 183, Oct. 22, 2015 (Oct. 22, 2015), pp. 113-123.

Suhang Xun et al., "Synthesis of novel metal nanoparitcles/SnNb2O6 nanosheets plasmonic nanocomposite photocatalysts with enhanced visible-light photocataiytic activity and mechanism insight", Journal of Alloys and Compounds, Elsevier Sequoia, Lausanne, CH, vol. 685, May 25, 2016 (May 25, 2016), pp. 347-655.

S.F. Matar et al., "Pressure induced metallization of fordite SnNb2O6 from first principles", Computational Materials Science, Elsevier, Amsterdam, NL, vol. 84, Jan. 10, 2014 (Jan. 10, 2014), pp. 355-359.

European Search Report for Serial No. 18758245.7 dated Nov. 24, 2020.

\* cited by examiner

P-TYPE OXIDE SEMICONDUCTOR AND SEMICONDUCTOR DEVICE HAVING PYROCHLORE STRUCTURE

CROSS-REFERENCE TO RELATED APPLICATIONS

This application is a National Stage application of International Patent Application No. PCT/JP2018/001728, filed on Jan. 22, 2018, which claims priority to Japanese Patent Application No. 2017-032112, filed on Feb. 23, 2017, each of which is hereby incorporated by reference in its entirety.

TECHNICAL FIELD

The present invention relates to an oxide semiconductor and a semiconductor device that consist of a composite oxide containing Sn, more particularly, an oxide semiconductor capable of realizing p-type semiconductor characteristics.

BACKGROUND

Conventionally, a transparent semiconductor material having high transparency in a visible light region and exhibiting high electrical conductivity is known as an oxide composite, and is widely used for a transparent electrode etc. For example, $In_2O_3$, ZnO, and $SnO_2$, and Sn-added $In_2O_3$, Al-added ZnO, Ga-added ZnO, Sb-added $SnO_2$, and F-added $SnO_2$, etc. obtained by adding an impurity to these base materials are known as transparent semiconductors, but those are n-type semiconductors in which all electrons become charge carriers. Meanwhile, semiconductors include p-type semiconductors in which holes are used as charge carriers. If the n-type and p-type semiconductors that are transparent in the visible light region are arranged in numbers etc., formation of a pn junction due to them makes it possible to produce diodes, transistors, and solar cells, etc. that are transparent in the visible light region.

$Cu_2O$ and NiO, etc. have been already known as p-type semiconductors, but are not transparent because they have light absorption in the visible light region and strong coloring. Since 1990, research and development of transparent p-type semiconductors have been promoted, and some new transparent p-type semiconductors have been reported. For example, reported have been: an oxide composite represented by a chemical formula of $ABO_2$ having a delafossite structure (A=at least one kind of Cu or Ag, B=at least one kind of Al, Ga, In, Sc, Y, Cr, Rh or La); an oxychalcogenide compound represented by a chemical formula of LnCuOCh (Ln=at least one kind of lanthanoid element or Y, Ch=at least one kind of S, Se, or Te); zinc oxide represented by a chemical formula of ZnO; and the like. However, a compound having the delafossite structure has low mobility of holes. Additionally, the oxychalcogenide compound has considerably high mobility and concentration of holes, but it is oxidized in an air atmosphere and deterioration in its characteristics is remarkable. Further, zinc oxide is originally an n-type semiconductor having electrons as charge carriers, thus needing to reduce, to the limit, concentration of structural defects for generating electrons and introduce structural defects that lead to expression of p-type semiconductor characteristics such as nitrogen. Such necessity makes it difficult to generate the n-type structural defects and/or reduce the concentration of the n-type structural defects due to the introduction of the p-type structural defects, which makes it further difficult to produce zinc oxide having the p-type semiconductor characteristics and leads to deterioration in reproducibility. Therefore, it is difficult to realize a transparent p-type semiconductor suitable for electronic devices.

Oxide semiconductors are expected as semiconductor materials resistant to oxidation reactions in the atmosphere containing oxygen. However, it is difficult to realize p-type conductivity with oxides. This is because the oxide has a structure in which electrons at a top of its valence band are localized on oxygen ions. A delafossite compound introduces d-orbital components of metal into a top of its valence band, and an oxychalcogenide compound introduces p-orbital components of a chalcogen element into a top of its valence band, thereby reducing the localization of electrons at each top of the valence bands. Then, if an s-orbit of a metal element having an electron's orbital radius larger than d-orbital and p-orbital radii is introduced into a top of its valence band, the introduction brings expectation of: reduction in the electron's localization at the top of the valence band; and achievement of having high mobility. Additionally, what is expected by an isotropic spherical structure of an s-orbit is to suppress deterioration in mobility with respect to disturbance in crystal structure, the disturbance causing variations in bonding angles or/and bonding distances. Based on such viewpoints, the followings have been reported: p-channel transistors are produced by using tin oxide (SnO) in which s-orbital components of tin are introduced into a top of its valence band (see, for example, International Publication No. WO 2010/010802). Further, a band gap of SnO is 0.7 eV that is smaller energy than that in a visible light region, and so is strongly colored in the visible light region. Consequently, known is that transparency in the visible light region cannot be ensured.

There are the following known documents related to an oxide having a pyrochlore structure.

Reported is that a metallic oxide, which has a pyrochlore structure represented by a composition formula $A_2B_2O_7$ (A=Sn, B=Nb, Ta), has a structure in which a top of its valence band is composed of 5s components of Sn (see Y. Hosogi, Y. Shimodaira, H. Kato, H. Kobayashi, A. Kudo, Chemistry of Materials 20, 1299 (2008)).

By a study on a structure of a compound described as $A_2B_2O_7$ (A=Sn, B=Nb, Ta) in a general chemical formula, known has been that: (1) a part of a divalent A site is deficient; and (2) a part of Sn, which is oxidized by a part of a pentavalent B side and becomes tetravalent, is substituted. These two structural defects become $Sn_{2-p}$ ($B_{2-q}Sn_q$) $O_{7-p-0.5q}$ if represented. Further, disclosed is that the pyrochlore structure is maintained in a range of p, q=0.1 to 0.48 (see M. A. Subramanian, G. Aravamudan, G. V. Subba Rao, Progress in Solid State Chemistry 15, 55 (1983)).

$Sn^{4+}/(Sn^{2+}+Sn^{4+})$ reported by Mossbauer spectroscopy is 0.116 for $Sn_2Nb_2O_7$ and 0.120 for $Sn_2Ta_2O_7$ (see D. J. Stewart, 0. Knop, R. E. Meads and W. G. Parker, Canadian J. Chemistry 51, 1041-1049 (1973)). However, those numerical values correspond to a case of A/B=1 in a stoichiometric composition, that is, $A_2B_2O_7$ (A=Sn, B=Nb, Ta). Meanwhile, since $Sn^{2+}_{1.52}Nb^{5+}_{1.59}Sn^{4+}_{0.41}O_{6.32}$ (Sn/Nb=1.21) and $Sn^{2+}_{1.76}Ta^{5+}_{1.56}Sn^{4+}_{0.44}O_{6.54}$ (Sn/Ta=1.41), which deviate from the stoichiometric composition, are respectively $Sn^{4+}/(Sn^{2+}+Sn^{4+})$=0.212 and $Sn^{4+}/(Sn^{2+}+Sn^{4+})$=0.20, it is reported that those values are higher than that of $Sn^{4+}/(Sn^{2+}+Sn^{4+})$ obtained at the case of the stoichiometric composition (see T. Birchall, A. W. Sleight, J. Solid State Chemistry 13, 118-130 (1975)). Incidentally, any of the reports about the stoichiometric and nonstoichiometric compositions do not mention that the above values show the p-type conduction.

Further, an oxide of a pyrochlore structure is reported that it has acted as a photocatalyst since an organic substance is decomposed by light irradiation (see Japanese Patent Application Laid-open No. 2003-117407 and Japanese Patent Application Laid-open No. 2004-344733 and Y. Hosogi, K. Tanabe, H. Kato, H. Kobayashi, A. Kudo, Chemistry Letters 33, 28 (2004)). Japanese Patent Application Laid-open No. 2003-117407 reports a photocatalyst of an oxide composition composed of $Sn_2Nb_2O_7$ (oxide semiconductor) and titanium oxide. The photocatalyst in Japanese Patent Application Laid-open No. 2003-117407 is formed of an oxide composition having a junction portion, the junction portion being made by heterogeneous oxide semiconductors in which electrons at a bottom of a conduction band and electrons at a top of a valence band are different in energy level. Moreover, Japanese Patent Application Laid-open No. 2003-117407 discloses Ta as an option similarly to Nb. Reported by Japanese Patent Application Laid-open No. 2004-344733 is a photocatalyst having any of a pyrochlore related structure, α-$PbO_2$ related structure, or a rutile related structure, the pyrochlore related structure being represented by $ABO_{4+a}$ ($-0.25 \leq a \leq 0.5$, A ion is Sn element, B ion is one or more kinds of elements selected from Nb and Ta) and having a structure in which an oxygen deficiency position in a pyrochlore type structure is filled with oxygen, the pyrochlore type structure having a structure in which oxygen ion deficiencies exist regularly when viewed from a fluorite structure and cations are regularly arranged. Y. Hosogi, K. Tanabe, H. Kato, H. Kobayashi, A. Kudo, Chemistry Letters 33, 28 (2004) is reported that $Sn_2Nb_2O_7$ having a pyrochlore structure does not express a photocatalyst while $Sn_2Ta_2O_7$ having the same pyrochlore structure has weak photocatalytic activity.

SUMMARY

Conventionally, transparent p-type semiconductors suitable for electronic devices have been difficult to realize in oxide semiconductors resistant to oxidation reactions in the atmosphere containing oxygen. Particularly, if transparent n-type and p-type semiconductors are prepared in the visible light region, a pn junction can be formed, which brings expectation of realizing the transparent semiconductor devices. However, such realization is difficult.

The present invention is intended to solve these problems. The present invention has an object of providing: a novel oxide semiconductor whose light absorption is less in a visible light region and which can realize high mobility of charge carriers; and a semiconductor device including such an oxide semiconductor.

The present invention also has an object of providing: an oxide semiconductor exhibiting p-type semiconductor characteristics; and a semiconductor device including such an oxide semiconductor.

The present invention has the following features to achieve the above objects.

(1) An oxide semiconductor comprises a composite oxide having a crystal structure, containing at least one or more kinds of elements selected from Nb and Ta, and containing Sn element, the crystal structure including a pyrochlore structure, $Sn^{4+}/(Sn^{2+}+Sn^{4+})$, which is a ratio of $Sn^{4+}$ to a total amount of Sn in the composite oxide, being 0.124 $Sn^{4+}/(Sn^{2+}+Sn^{4+})$ 0.148, and its holes becoming charge carriers.

(2) In the oxide semiconductor in accordance with (1), the composite oxide is an oxide represented by $A_2B_2O_7$ (A is Sn, B is at least one or more kinds of elements selected from Nb and Ta) in a general chemical formula.

(3) In the oxide semiconductor in accordance with (1) or (2), at least one or more kinds of elements selected from a group composed of W, Zr, V, Mn, Ti, Ga, Hf, and Mo is added as an additive element.

(4) In the oxide semiconductor in accordance with (3), the additive element is 0.001 atom % or more and 10 atom % or less in total of an additive element.

(5) In the oxide semiconductor in accordance with any one of (1) to (4), Sn /(Nb+Ta) is in a range of 1±0.02.

(6) A semiconductor device including the oxide semiconductor in according with any one of (1) to (5).

According to the present invention, a transparent and high-mobility semiconductor having a wide gap can be realized in the oxide semiconductor. Further, a p-type oxide semiconductor can be realized by the oxide semiconductor of the present invention. According to the present invention, when the ratio $Sn^{4+}/(Sn^{2+}+Sn^{4+})$ of $Sn^{4+}$ to the total amount of Sn in a substance is 0.124 $Sn^{4+}/(Sn^{2+}+Sn^{4+})$ 0.148, a p-type can be realized by generating a structural defect $Sn'_B$ in which $Sn^{4+}$ substitutes a part of a B site of structural formula $A_2B_2O_7$ (A=Sn, B=Nb, Ta) having a pyrochlore structure.

In the oxide semiconductor of the present invention, a top of a valence band is formed of a 5s component of Sn. Consequently, since an s-orbital has an isotropic spherical shape with a large orbital radius, effects of reducing localization of electrons and achieving high mobility even for structural disorder are obtained.

Since the semiconductor of the present invention consists of the oxide and has weatherability, an electronic device excellent in weatherability can be realized by forming a pn junction of the p-type oxide semiconductor of the present invention and an n-type oxide semiconductor.

Some oxide semiconductors of the present invention have structures in which any one or more of Nb or Ta at a B site is contained in $A_2B_2O_7$ (A=Sn, B=Nb, Ta) representing a pyrochlore structure. This structure makes it possible for the oxide semiconductor to have: a band gap (Eg) of 2.3 eV when the B sites are all Nb; the Eg of 3.0 eV when the B sites are all Ta; and the Eg is in a range of 2.3<Eg<3.0 when the B sites are mixed with Nb and Ta. Therefore, the above oxide semiconductor can be realize a wide gap, and has high transparency in the visible light region.

In the oxide semiconductor of the present invention, at least one or more kinds of elements selected from the group consisting of W, Zr, V, Mn, Ti, Ga, Hf, and Mo may be added, and the oxide semiconductors containing additive elements show properties (effects) similar to those in a case of containing no additive element. When an additive element is contained, for example, the oxide semiconductor preferably contains 0.001 to 10 atom % in the total of the additive elements, and can realize a p-type oxide semiconductor.

Since the semiconductor device of the present invention includes the oxide semiconductor having the above-described effects, the following operations and effects can be expected. By forming the pn junction made of the oxide semiconductor of the present invention, realized can be a transistor, a diode, and an integrated circuit that further uses its rectification characteristics. Additionally, the semiconductor device can be applied also to a light-emitting diode and a solar cell that correspond to a band gap of a semiconductor constituting a pn junction.

DETAILED DESCRIPTION

Embodiments of the present invention will be described below.

The inventors of the present invention have: paid attention to, in an oxide composite with a pyrochlore structure, an influence on semiconductor characteristics exerted in accordance with a ratio $[Sn^{4+}/(Sn^{2+}+Sn^{4+})]$ of $Sn^{4+}$ to the total amount of Sn in an oxide composite; researched and developed the oxide composite; and obtained an oxide semiconductor having excellent semiconductor characteristics and p-type semiconductor characteristics.

An oxide semiconductor according to an embodiment of the present invention is a semiconductor: enhancing ionicity of bonding by forming a double oxide with $B_2O_5$ (B=Nb, Ta) with respect to SnO having a small band gap, a top of whose valence band is composed of a 5s orbital of Sn; mainly having a pyrochlore structure as a crystal structure about composition formula $A2B_2O_7$ (A=Sn, B=Nb, Ta) that realizes a band gap made wide; and indicating that a ratio $Sn^{4+}/(Sn^{2+}+Sn^{4+})$ of $Sn^{4+}$ to the total amount of Sn is $0.124 \leq Sn^{4+}/(Sn^{2+}+Sn^{4+}) \leq 0.148$.

Additionally, the oxide semiconductor according to the embodiment of the present invention is found to be a semiconductor that: is described in a simplified manner by a general formula of $A_2B_2O_7$ (A=Sn, B=Nb, Ta) as a stoichiometric composition; and has a structural defect in which a part of $Sn^{2+}$ contained to forms holes serving as p-type charge carriers is oxidized to $Sn^{4+}$ and a part of an $B^{5+}$ site is substituted, such a structural defect being represented as "$Sn'_B$" by the Kroger-Vink notation that is a notation of a structural defect.

As explained in M. A. Subramanian, G. Aravamudan, G. V. Subba Rao, Progress in Solid State Chemistry 15, 55 (1983), a compound represented by $A_2B_2O_7$ (A=Sn, B=Nb, Ta) in a general chemical formula becomes $A_{2-p}(B_{2-q}Sn_q)O_{7-p-0.5q}$ if two structural defects are represented. A pyrochlore structure is maintained within a range of p, q=0.1 to 0.48. However, those two structural defects are respectively represented as "$V''_A$" and "$Sn'_B$" by the Kroger-Vink notation, and both become structural defects with negative charges. Therefore, the generation of those defects is considered to become a center of a structural defect that leads to the generation of holes in any case.

Here, the ratio $Sn^{4+}/(Sn^{2+}+Sn^{4+})$ of $Sn^{4+}$ to the total Sn amount of $(Sn^{2+}+Sn^{4+})$ indicates that the defect "$Sn'_B$", in which the $B^{5+}$ site is substituted for $Sn^{4+}$, is reflected as long as precipitation of $SnO_2$ is not recognized.

No oxide composite of a pyrochlore structure containing Sn has conventionally exhibited p-type semiconductor characteristics including M. A. Subramanian, G. Aravamudan, G. V. Subba Rao, Progress in Solid State Chemistry 15, 55 (1983). This is considered as follows: conditions for generating an appropriate amount of $Sn^{4+}$, a defect $Sn'_B$ substituting a B site, and a defect $V''_{Sn}$ lacking $Sn^{2+}$ have not been found and, additionally thereto, the generations of a minus monovalent defect $Sn'_B$ and a minus divalent defect $V''_{Sn}$ simultaneously brings the generation of plus divalent oxygen deficiency $V^{}_O$, so that expression of p-type conduction due to the generation of holes cannot be obtained for charge compensation. Amounts of generations of the structural defects "$Sn'_B$", "$V''_{Sn}$", and "$V^{}_O$" considered here are considered to depend on temperature and atmosphere gas conditions at a time of producing the oxide composite. In the present invention, appropriately controlling the temperature and atmosphere gas conditions at a time of sample preparation brings a discovery of the optimum condition that "$Sn'_B$" is generated and "$V^{**}_O$" is hardly generated. Such a discovery is considered to lead to the expression of the p-type semiconductor characteristics. The p-type semiconductor characteristics are expressed also in the form of bulk or thin film.

An oxide of the present invention, which has the crystal structure including the pyrochlore structure, only has to mainly include a crystal structure of a pyrochlore structure. Incidentally, the term "mainly" refers to, for example, more than 50 weight % of the whole. Of course, the entire crystal structure is preferably composed of a pyrochlore structure. However, the oxide can be permitted to be composed of a crystal structure slightly having a structure other than the pyrochlore structure, and it is preferable that the crystal structure is substantially composed of the pyrochlore structures. The term "substantially" means, for example, 80 weight % or more.

Exemplified as a semiconductor device according to the present invention is a pn junction element in which a pn junction is formed by a p-type semiconductor of the present embodiment and an n-type semiconductor. Given as the n-type semiconductors suitable for the pn junction element are: $In_2O_3$, ZnO, and $SnO_2$; Sn-added $In_2O_3$, Al-added ZnO, Ga-added ZnO, Sb-added $SnO_2$, and F-added $SnO_2$ in which impurities are added to those base materials; and the like. Particularly, ZnO is preferable in that it has a feature capable of production from an insulator to a semiconductor due to easiness of control of carrier concentration and, additionally thereto, is capable of easy etching in patterning and has no problem of using a rare raw material.

First Embodiment

In the present embodiment, explained will be an oxide semiconductor essentially containing Sn, containing one or more elements selected from Nb and Ta, and including an oxide composite that has a crystal structure including a pyrochlore structure. Examined in an oxide composite having a pyrochlore structure consisting of Sn, Nb, Ta, and oxygen have been characteristics corresponding to a ratio $Sn^{4+}/(Sn^{2+}+Sn^{4+})$ of $Sn^{4+}$ to an amount of $(Sn^{2+}+Sn^{4+})$. As described below, when $Sn^{4+}/(Sn^{2+}+Sn^{4+})$ satisfies $0.124 \leq Sn^{4+}/(Sn^{2+}+Sn^{4+}) \leq 0.148$, p-type semiconductor characteristics in which holes are used as charge carriers lead to expression.

[Production of Oxide Composite With Crystal Structure Essentially Containing Sn, Containing One or More Elements of Nb and Ta, and Including Pyrochlore Structure]

SnO powder (High purity Materials KOJUNDO CHEMICAL LABORATORY CO. LTD, 99.5% purity), $Nb_2O_5$ powder (High purity Materials KOJUNDO CHEMICAL LABORATORY CO. LTD, 99.9% purity), and $Ta_2O_5$ powder (High purity Materials KOJUNDO CHEMICAL LABORATORY CO. LTD, 99.9% purity) were weighed, and the weighed powders were placed in a mortar made of agate and were wet-mixed for about 1 hour while ethanol (Wako Pure Chemical Corporation, special grade) was added thereto. At this time, SnO, $Nb_2O_5$ and $Ta_2O_5$ were mixed so that a ratio (Sn/(Nb+Ta)) of Sn to (Nb+Ta) was 1.00 in atomic ratio. Further, Nb and Ta were mixed so that a ratio of Nb and Ta meets Nb:Ta=2:0, 1.5:0.5, and/or 0:2. In other words, this is identical to a case of x=0, 0.5, and/or 2 in general chemical formula $Sn_2Nb_{2-x}Ta_xO_7$. Table 1 collectively shows amounts of weighed reagents in preparing samples.

TABLE 1

| x | SnO | $Nb_2O_5$ | $Ta_2O_5$ |
|---|---|---|---|
| 0 | 2.707 g | 2.661 g | 0 |
| 0.5 | 2.707 g | 1.905 g | 1.106 g |
| 2 | 2.707 g | 0 | 4.423 g |

Thereafter, the mixture was left overnight at room temperature to dry the ethanol, and was divided into 6 powder groups approximately equal to one another. Each power group was uniaxially pressurized (15 mm in diameter, 170 MPa) to produce six disk-shaped green compacts. The green compacts were placed on an alumina boat, put in an electric furnace having an alumina core tube whose diameter is 50 mm and whose length is 800 mm, and were temporarily calcined at 1173 K for 4 hours while nitrogen gas was caused to flow therein at a flow rate of 150 ml/minute. The temporarily calcined green compacts were crushed in the agate mortar, were mixed with ethanol after addition of a polyvinyl alcohol aqueous solution as a binder to a sample by 2 wt. %, and were left overnight at room temperature for drying. Then, the dried samples were sifted so that each of their particle size is adjusted to 212 μm or less, and were subjected to hydrostatic molding (285 MPa) after their uniaxially pressurization (15 mm in diameter, 170 MPa). Consequently, compacts each having a diameter of about 15 mm and a thickness of about 1.2 mm were produced. The obtained compacts were placed on an alumina boat, and were subjected to main calcination within a range of 853 K to 1173 K for 4 hours while nitrogen gas is caused flow (flow rate: 50 ml/min, but 200 ml/min only in sample number 8). Main calcination temperature of each sample is shown in Table 2 described later. Additionally, the sample numbers 1-3 in Table 2 are samples in which x=0 in $Sn_2Nb_{2-x}Ta_xO_7$, the sample numbers 4-6 are samples in which x=0.5 therein, and the sample numbers 7-9 are samples in which x=2 therein.

[Percentage of Sn Valence and Electric Characteristics]

Identification of crystal structures of the obtained samples were performed by using an X-ray diffractometer (PANalytical, X' Pert Pro MRD). A composition ratio of (Sn/(Nb+Ta)) after the calcination was estimated by using a wavelength dispersion type fluorescence X-ray analyzer (Rigaku, ZSX). Electric characteristics of the samples were evaluated by using a Hall effect measuring device (TOYO Corporation, Resitest 8310) through a Van der Pauw placement after a sample in which gold electrodes were deposited on four corners of a circular sample was prepared. Seebeck coefficients of the samples were evaluated by using a thermoelectric characteristic evaluation device (ADVANCE RICO, inc., ZEM-3). The measurements of the X-ray diffraction, fluorescence X-ray, and the Hall effect measurements were performed at 300 K, and the Seebeck measurements were performed at 323 K. The estimation of Sn contents of $Sn^{4+}$ and $Sn^{2+}$ in each sample was made by a Mossbauer spectroscopy through a transmission method. Measurements were made at two points of room temperature (300 K) and liquid nitrogen temperature (78 K). The obtained $^{119}Sn$ Mossbauer spectrum was subjected to least squares fitting using the Lorentz curve, and integrated intensity of absorption peaks, that is, integrated absorption intensity was found. Here, since a tetravalent Sn site and a bivalent Sn site are different in temperature dependence of recoil-free fraction f (Debye temperatures are different), there are tendencies to underestimate an amount of divalent Sn and to overestimate an amount of tetravalent Sn if a value of a ratio of peak integrated absorption intensity of data at relatively high temperature (room temperature) is used as it is. Therefore, f was corrected by: fitting, by high-temperature approximation of the Debye model, the temperature dependence of absolute integrated absorption intensity for each site; and finding the Debye temperature for each site. Specifically, High-temperature Approximation Equation (1) of the Debye model was applied to the temperature dependency of the normalized integrated absorption intensity, and the Debye temperature was determined for each sample and each site.

a. $\ln f = -(6 E_R/k_B \theta_D^2)T$ (1)

b. $E_R = E_\gamma^2/2 Mc^2$ (2)

c. $A = \text{const.} \times f$ (3)

i. f: Recoil-free fraction
ii. T: Measurement temperature
iii. $\theta_D$: Debye temperature
iv. $k_B$: Boltzmann constant
v. $E_R$: Recoil energy
vi. $E_\gamma$: Mossbauer gamma ray energy (23.87 keV)
vii. M: Recoil nuclear mass (118.90331 u)
viii. c: Light velocity
ix. A: Integrated absorption intensity The obtained Debye temperatures were used to find the recoil-free fraction at each temperature by Equation (1) and correct the integrated absorption intensity and, then, an integrated intensity ratio of tetravalent and divalent Sn sites was found. A value obtained from this ratio was set as a quantitative value independent of temperature.

Figure 1:
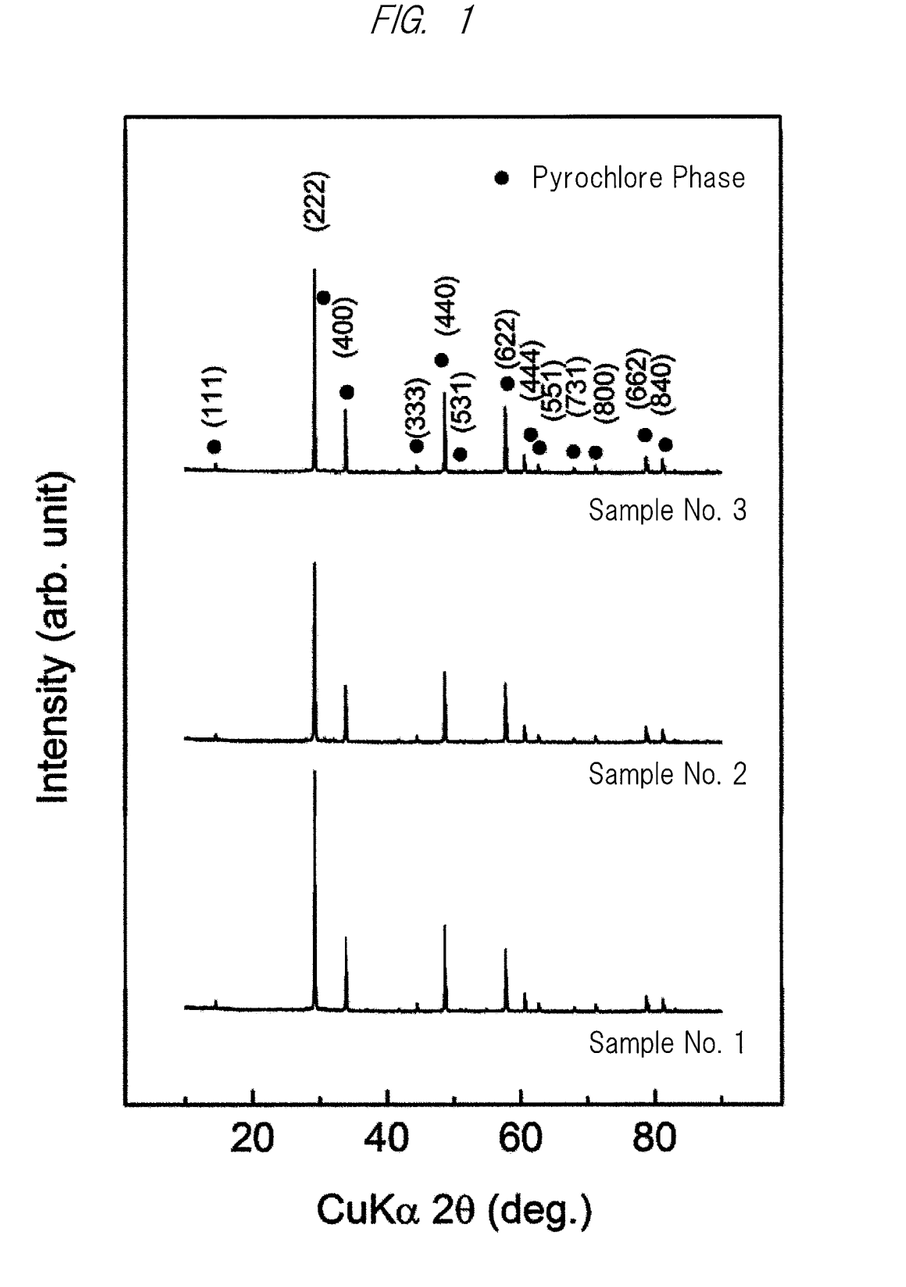
FIG. 1 is a drawing showing X-ray-diffraction patterns in a case of oxide composite $Sn_2Nb_{2-x}Ta_xO_7$ (x=0) (sample numbers 1-3) in a first embodiment.
Figure 2:
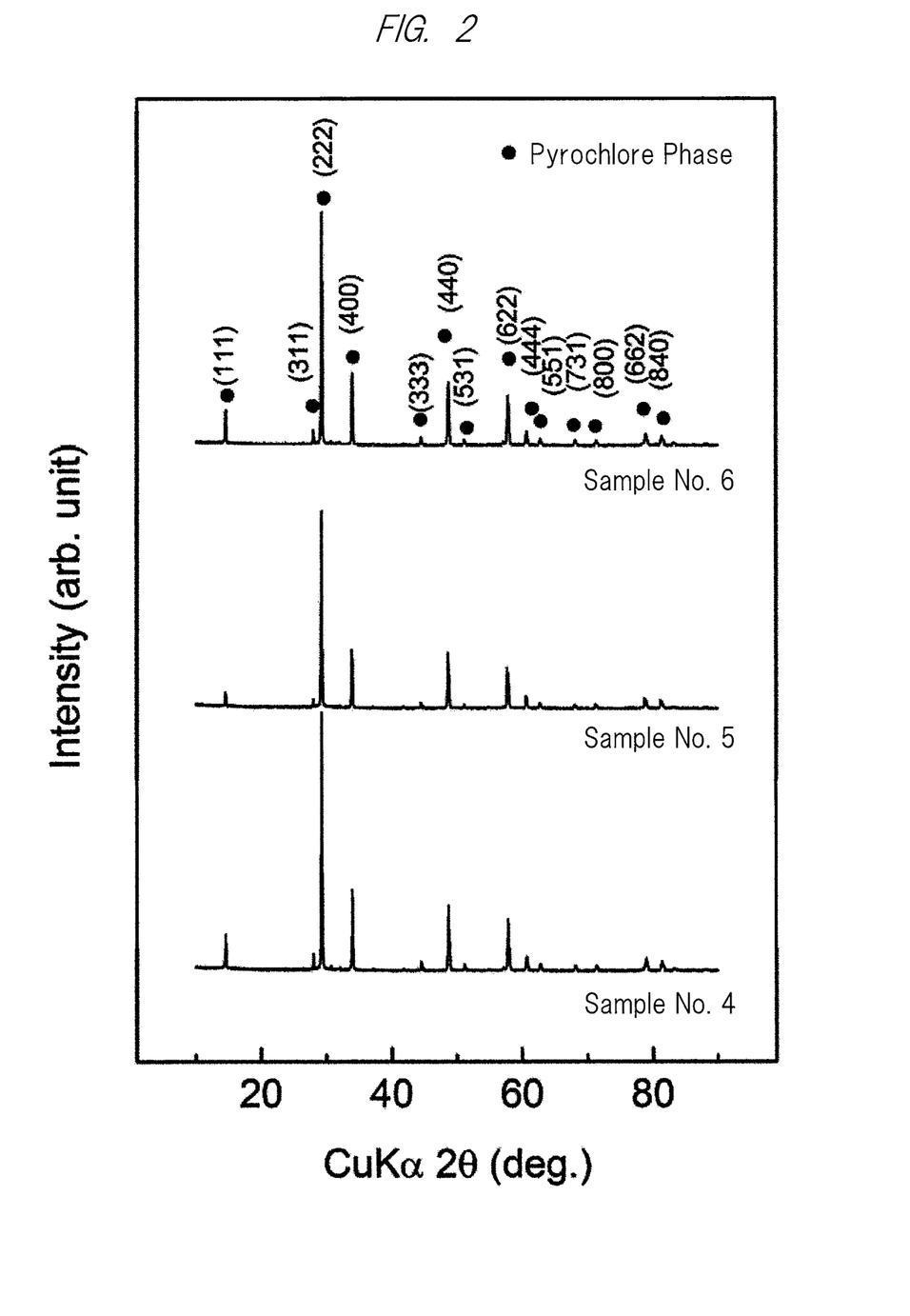
FIG. 2 is a drawing showing X-ray-diffraction patterns in a case of oxide composite $Sn_2Nb_{2-x}Ta_xO_7$ (x=0.5) (sample numbers 4-6) in the first embodiment.
Figure 3:
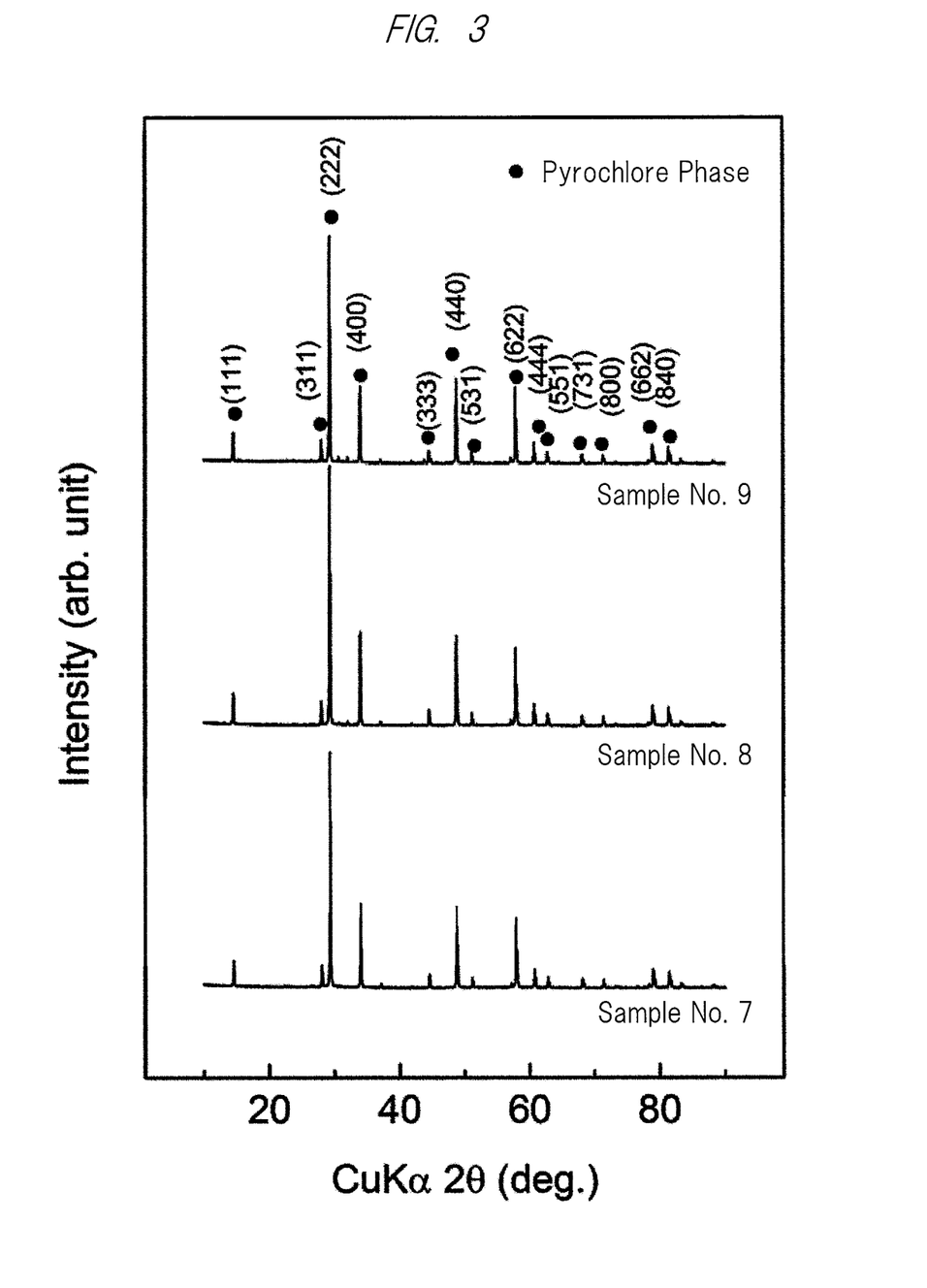
FIG. 3 is a drawing showing X-ray-diffraction patterns in a case of oxide composite $Sn_2Nb_{2-x}Ta_xO_7$ (x=2) (sample numbers 7-9) in the first embodiment.

Each of FIGS. 1 to 3 shows an X-ray-diffraction-pattern change in main calcination temperatures about each sample at x=0, 0.5, 2 in $Sn_2Nb_{2-x}Ta_xO_7$. Each horizontal axis in FIGS. 1 to 3 indicates a diffraction angle 2θ to an incident angle θ using a CuKα ray. The X-ray diffraction pattern in each case represents only a peak ((222), (400), (440), and (622) etc. plotted by block circles) belonging to $Sn_2M2O_7$ (M=Nb, Ta) that has a pyrochlore structure belonging to a cubic system. Understood from this can be that each of the sample numbers 1-9 corresponding to x=0, 0.5, 2 in $Sn_2Nb_{2-x}Ta_xO_7$ has a crystal structure having the pyrochlore structure belonging to the cubic system regardless of a difference in the main calcination temperature.

Additionally, from results of a composition analysis by a fluorescence X-ray, each of the samples corresponding to x=0, 0.5, 2 in $Sn_2Nb_{2-x}Ta_xO_7$, that is, the sample numbers 1-9 shows that all of $Sn/(Nb_{2-x}Ta_x)$ is 1.0 identical to a value of its charged amount. Namely, Sn in a main calcination temperature range (853 to 1173 K (580 to 900° C.)) is considered to be hardly evaporated.

Figure 4:
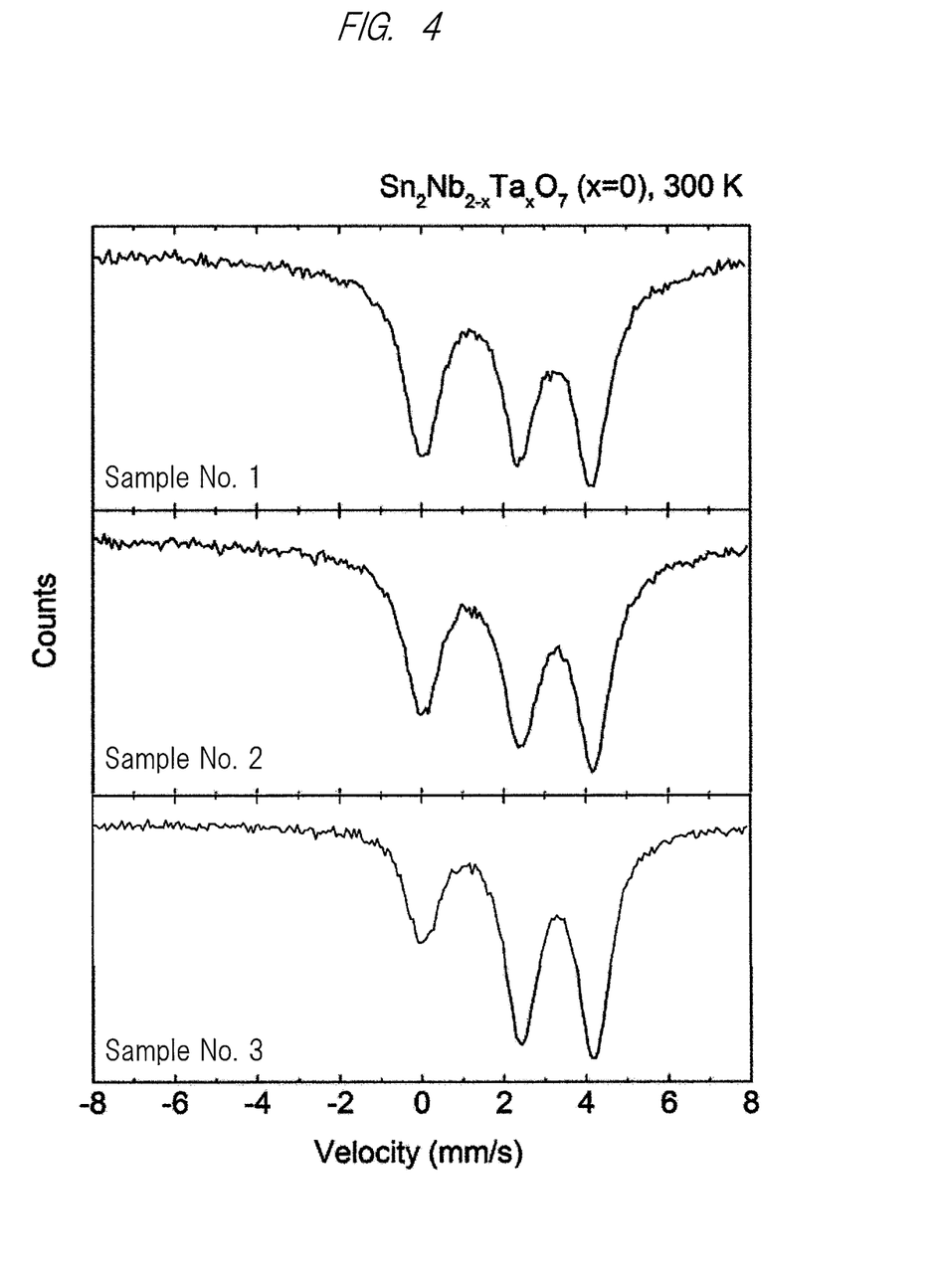
FIG. 4 is a drawing showing $^{119}Sn$ Mossbauer spectrum measured by 300 K in the case of oxide composite $Sn_2Nb_{2-x}Ta_xO_7$ (x=0) (sample numbers 1-3) in the first embodiment.
Figure 5:
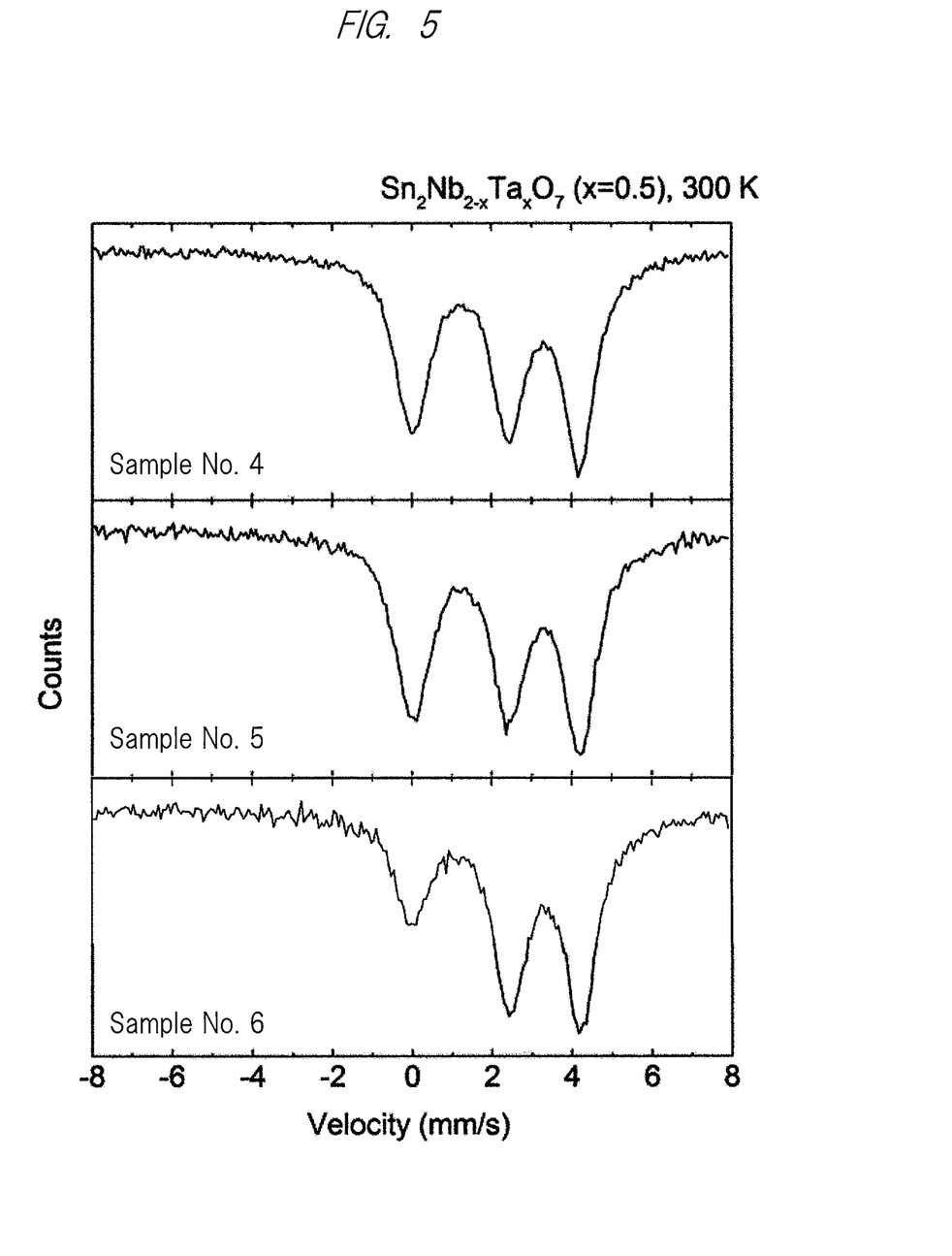
FIG. 5 is a drawing showing $^{119}Sn$ Mossbauer spectrum measured by 300 K in the case of oxide composite $Sn_2Nb_{2-x}Ta_xO_7$ (x=0.5) (sample numbers 4-6) in the first embodiment.
Figure 6:
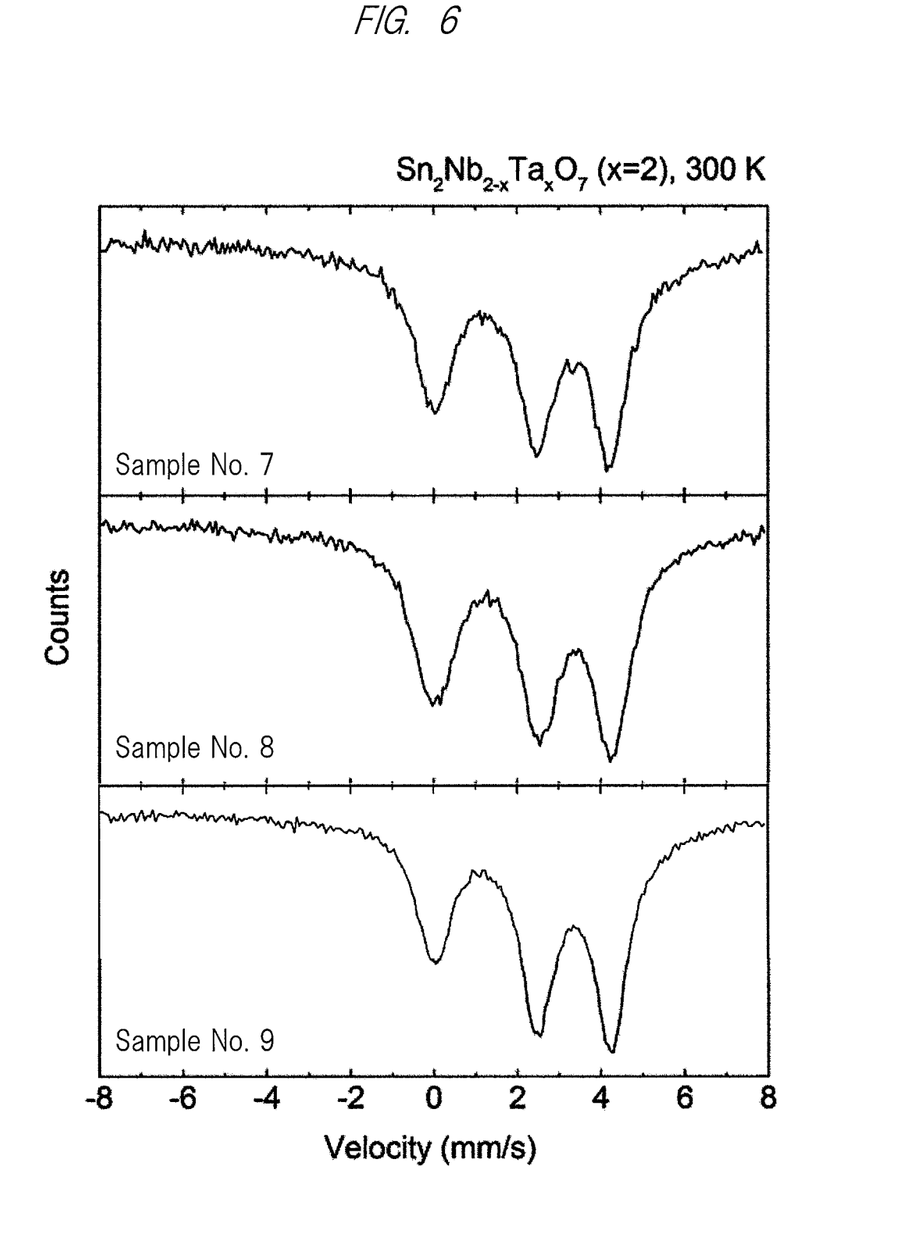
FIG. 6 is a drawing showing $^{119}Sn$ Mossbauer spectrum measured by 300 K in the case of oxide composite $Sn_2Nb_{2-x}Ta_xO_7$ (x=2) (sample numbers 7-9) in the first embodiment.

Each of FIGS. 4 to 6 shows, by solid lines, a change in $^{119}Sn$ Mossbauer spectra at each main calcination temperature about each of the samples corresponding to x=0, 0.5, 2 in $Sn_2Nb_{2-x}Ta_xO_7$. Incidentally, measurement temperature of the spectrum is 300 K. Each horizontal axis in FIGS. 4 to 6 is the Doppler velocity. Three absorption peaks are observed in all the spectra. One peak near 0 mm/s is a peak due to $Sn^{4+}$, and two peaks at 2 to 6 mm/s are peaks due to $Sn^{2+}$. Therefore, coexistence of $Sn^{4+}$ and $Sn^{2+}$ in all the sample numbers 1-9 is understood.

Here, a ratio $Sn^{4+}/(Sn^{2+}+Sn^{4+})$ of $Sn^{4+}$ to the total Sn amount $(Sn^{2+}+Sn^{4+})$ is found from $^{119}Sn$ Mossbauer spectrum. As described above, when the ratio is simply obtained from integrated absorption intensity ratios of these peaks, there are tendencies to underestimate the amount of divalent Sn and overestimate the amount of tetravalent Sn. Therefore, the integrated absorption intensity is corrected. The sample number 1 will be concretely described as an example.

Figure 7:
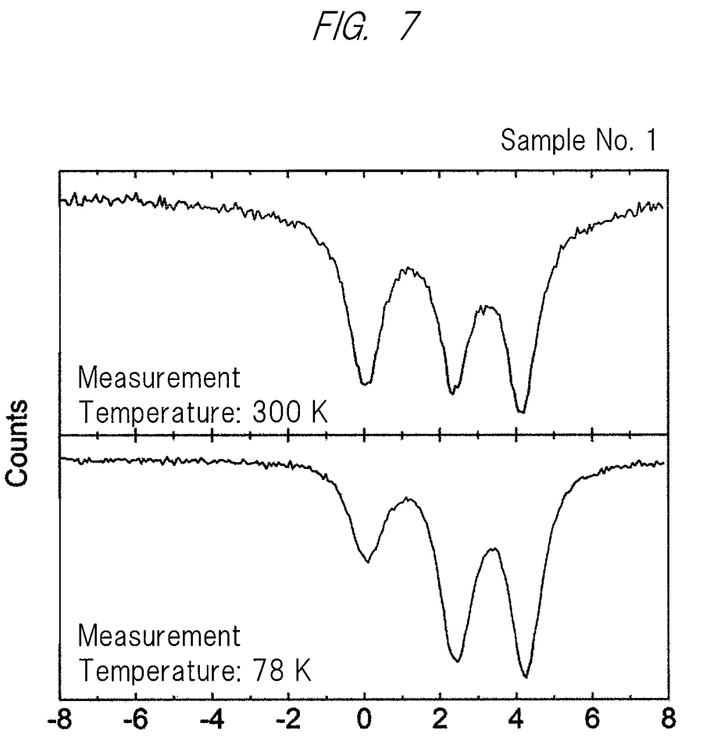
FIG. 7 is a drawing showing $^{119}Sn$ Mossbauer spectra in cases where measurement temperatures of oxide composite $Sn_2Nb_{2-x}Ta_xO_7$ (x=0) (sample number 1) are 300K and 78K in the first embodiment.

FIG. 7 shows $^{119}Sn$ Mossbauer spectra of the sample number 1 measured at 300 K and 78 K. First, a peak area (corresponding to integrated absorption intensity A) at each temperature is found. Since the integral absorption intensity A and the recoil-free fraction f have a relationship of Equation (3), a parenthesis on the right side of Equation (1) corresponds to an inclination representing a relationship (lnA vs. T) between natural logarithm (lnA) of the integrated absorption intensity and temperature T. Debye temperature θD was found from this inclination. Next, Equation (1) was used to find recoil-free fractions f at 300 K and 78 K from the found Debye temperature $\theta_D$. From a relationship between the obtained recoil-free fraction f at each temperature and the integrated absorption intensity A at the temperature, corrected integrated absorption intensity $A_{corr}$ when it is assumed that the recoil-free fraction f is equal to 1 (f=1) was calculated as a quantitative value independent of measurement temperature.

Integrated absorption intensity A at the measurement temperature of 78 K was 0.031550 from the peak due to $Sn^{4+}$, and was 0.138330 from the peak due to $Sn^{2+}$. Integrated absorption intensity A at the measurement temperature of 300 K was 0.018353 from the peak due to $Sn^{4+}$ and was 0.037422 from the peak due to $Sn^{2+}$. The inclination $(\Delta lnA/\Delta T)$ (−0.00244 at $Sn^{4+}$ and −0.00589 at $Sn^{2+}$) was obtained from these integrated absorption intensities, and the Debye temperature $\theta_D$ (271 K at $Sn^{4+}$, and 174 K at $Sn^{2+}$) was obtained from these inclinations. From these Debye temperatures $\theta_D$, Equation (1) was used to find recoil-free fraction f at 78 K (0.8267 at $Sn^{4+}$ and 0.6317 at $Sn^{2+}$), and recoil-free fraction f at 300 K (0.4809 at $Sn^{4+}$ and 0.1709 at $Sn^{2+}$) was obtained. Next, the corrected integrated absorption intensity Acorr when it is assumed that the recoil-free fraction ratio f is equal to 1 (f=1) was found so that $Sn^{4+}$ is 0.0382 and $Sn^{2+}$ is 0.2190 at both of the measurement temperatures of 78K and 300K. Then, the corrected integrated absorption intensity $A_{corr}$ was calculated as a quantitative value independent of the measurement temperature. When this is expressed as an intensity ratio (sum is 1), the expression was calculated so that $Sn^{4+}$ is 0.148, $Sn^{2+}$ is 0.852, and $Sn^{4+}/(Sn^{2+}+Sn^{4+})$ is 0.148.

Table 2 collectively shows $Sn^{4+}/(Sn^{2+}+Sn^{4+})$ and electric measurement results (specific resistance, concentration of charge carriers, mobility, and Seebeck coefficient), which are found from $^{119}Sn$ Mossbauer spectra, about samples different from x of $Sn_2Nb_{2-x}Ta_xO_7$ and main calcination temperature.

TABLE 2

| | Production Conditions | | Measurement Results | | | | |
|---|---|---|---|---|---|---|---|
| Sample Nos. | x | Main Calcination Temperature (K) | $Sn^{4+}/$ $(Sn^{2+} + Sn^{4+})$ | Specific Resistance ($\Omega cm$) | Concentration of Charge Carrier ($cm^{-3}$) | Mobility ($cm^2V^{-1}s^{-1}$) | Seebeck Coefficients ($VK^{-1}$) |
| 1 | 0 | 1023 | 0.148 | $1.0 \times 10^2$ | $2.5 \times 10^{17}$ | $2.4 \times 10^{-1}$ | $+5.6 \times 10^{-6}$ |
| 2 | 0 | 1073 | 0.130 | $4.4 \times 10^4$ | $2.1 \times 10^{15}$ | $6.7 \times 10^{-2}$ | $+2.2 \times 10^{-3}$ |
| 3 | 0 | 1173 | 0.089 | — | — | — | — |
| 4 | 0.5 | 1023 | 0.145 | $2.3 \times 10^2$ | $2.0 \times 10^{17}$ | $1.4 \times 10^{-1}$ | $-6.5 \times 10^{-6}$ |
| 5 | 0.5 | 853 | 0.141 | $1.3 \times 10^4$ | $5.1 \times 10^{13}$ | $1.7 \times 10^1$ | $-4.1 \times 10^{-4}$ |
| 6 | 0.5 | 1173 | 0.092 | — | — | — | — |
| 7 | 2 | 1023 | 0.125 | $2.1 \times 10^2$ | $1.4 \times 10^{18}$ | $2.8 \times 10^{-2}$ | $+8.5 \times 10^{-6}$ |
| 8 | 2 | 1023 | 0.124 | $2.5 \times 10^4$ | $8.5 \times 10^{14}$ | $3.1 \times 10^{-1}$ | $+1.1 \times 10^{-5}$ |
| 9 | 2 | 1173 | 0.093 | — | — | — | — |

In Table 2, the sample numbers 1-3 correspond to x=0 in $Sn_2Nb_{2-x}Ta_xO_7$, that is $Sn_2Nb_2O_7$, but their electric characteristics like the samples (sample numbers 1-2) showing p-type conduction and the sample (sample number 3) showing insulating properties are found to be different on main calcination temperatures. $Sn^{4+}/(Sn^{2+}+Sn^{4+})$ in these samples is found indicating that each of the samples (sample numbers 1-2) showing the p-type conduction has a value higher than that of the sample (sample number 3) showing the insulating properties. Further, the samples (sample numbers 1-2) showing the p-type conduction are found indicating that the sample (sample number 1) with high concentration of charge carriers has a higher value of $Sn^{4+}/(Sn^{2+}+Sn^{4+})$ than that of the sample (sample number 2) with low concentration thereof. Namely, concentration of the holes which are charge carriers exhibiting p-type depends on a ratio of $Sn^{4+}$, and shows high concentration of the holes when the ratio of $Sn^{4+}$ is high. In other words, this means to have some relationship with the amount of structural defect Sn'B that produces the holes. Further, almost the same tendencies appear also in the samples (sample numbers 4-6) corresponding to x=0.5 in $Sn_2Nb_{2-x}Ta_xO_7$ and the samples (sample numbers 7-9) corresponding to x=2 therein.

Figure 8:
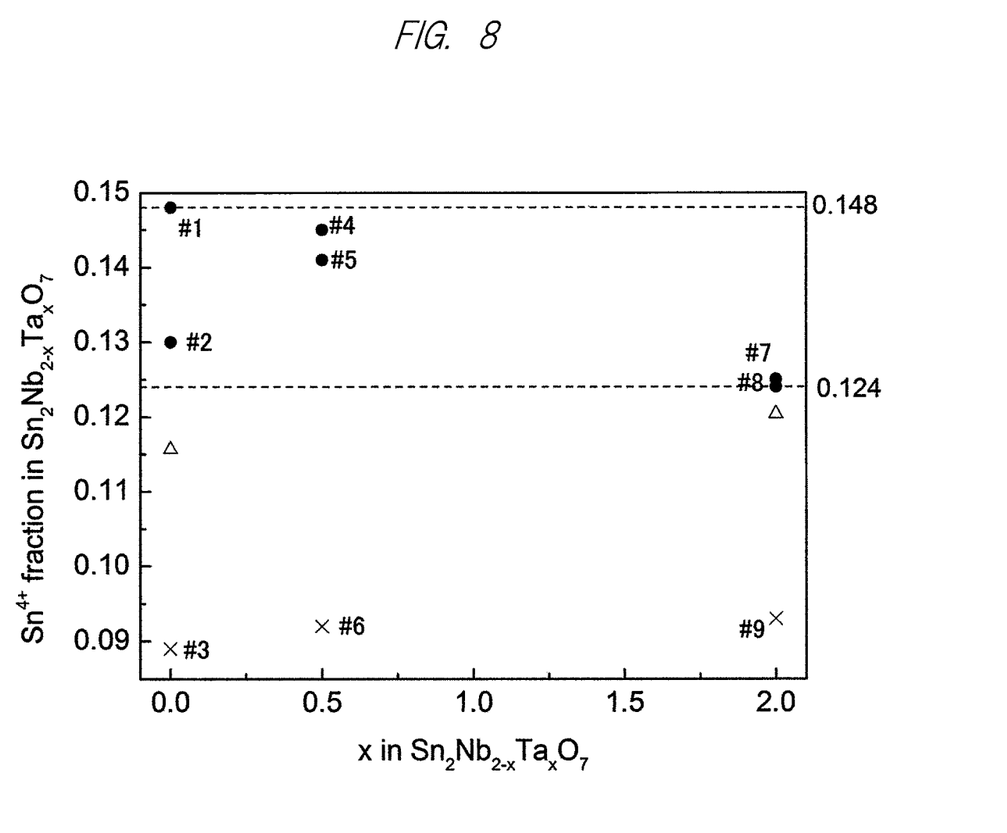
FIG. 8 is a drawing plotting, about $Sn^{4+}/(Sn^{2+}+Sn^{4+})$ and x, samples (black circles) indicating p-type conductivity, samples (x symbols) indicating insulating properties, and samples (Δ symbols) not reported on p-type conductivity shown in D. J. Stewart, O. Knop, R. E. Meads and W. G. Parker, Canadian J. Chemistry 51, 1041-1049 (1973).

FIG. 8 shows that the samples of the sample numbers 1-9 and the sample disclosed in D. J. Stewart, O. Knop, R. E. Meads and W. G. Parker, Canadian J. Chemistry 51, 1041-1049 (1973) are plotted as x in $Sn_2Nb_{2-x}Ta_xO_7$ represented on a horizontal axis and as $Sn^{4+}/(Sn^{2+}+Sn^{4+})$ represented on a vertical axis. The samples (sample numbers 1, 2, 4, 5, 7, and 8) showing p-type conductivity are found to be distributed in a range of $0.124 \leq Sn^{4+}/(Sn^{2+}+Sn^{4+}) \leq 0.148$ from, in $Sn_2Nb_{2-x}Ta_xO_7$, samples (#1, #2, #4, #5, #7, and #8 corresponding to the sample numbers 1, 2, 4, 5, 7, and 8, respectively) (black circle marks) showing p-type conductivity, samples (#3, #6, and #9 corresponding to the sample numbers 3, 6, and 9, respectively) (× marks) showing insulating properties, and the sample (Δ marks) disclosed in D. J. Stewart, O. Knop, R. E. Meads and W. G. Parker, Canadian J. Chemistry 51, 1041-1049 (1973) and not reported to have a p-type conductivity. Namely, $Sn_2Nb_{2-x}Ta_xO_7$ having a pyrochlore structure shows that, regardless of x, holes serving as p-type charge carriers depends on a ratio $[Sn^{4+}/(Sn^{2+}+Sn^{4+})]$ of $Sn^{4+}$ to the total Sn amount $(Sn^{2+}+Sn^{4+})$ and the ratio has a relationship with the structural defect Sn'B producing the holes. Therefore, it is understood that $0.124 \leq Sn^{4+}/(Sn^{2+}+Sn^{4+}) \leq 0.148$ exhibits the p-type conduction.

Meanwhile, in T. Birchall, A. W. Sleight, J. Solid State Chemistry 13, 118-130 (1975) described as the conventional technique, $Sn^{4+}/(Sn^{2+}+Sn^{4+})$ in the nonstoichiometric composition is 0.20 or 0.212, and shows that its value is higher than that (0.116 or 0.120 disclosed in D. J. Stewart, O. Knop, R. E. Meads and W. G. Parker, Canadian J. Chemistry 51, 1041-1049 (1973)) in the stoichiometric composition. Thus, how excess Sn is distributed to $Sn^{2+}$ and $Sn^{4+}$ was calculated in the nonstoichiometric composition. Consequently, from each compositional formula of the stoichiometric composition and the nonstoichiometric composition and the value of $Sn^{4+}/(Sn^{2+}+Sn^{4+})$, the excess Sn was found to distribute 67% to $Sn^{4+}$ and 33% to $Sn^{2+}$ in $Sn^{2+}_{1.52}Nb^{5+}_{1.59}Sn^{4+}_{0.41}O_{6.32}$ (Sn Nb=1.21), and 40% to $Sn^{4+}$ and 60% to $Sn^{2+}$ in $Sn^{2+}_{1.76}Ta^{5+}_{1.56}Sn^{4+}_{0.44}O_{6.54}$ (Sn/Ta=1.41). That is, the excess Sn can be considered to be approximately equally distributed to $Sn^{4+}$ and $Sn^{2+}$. When $A_2B_2O_7$ (A=Sn, B=Nb, Ta) satisfies A/B=1.02, that is, when an excess amount of Sn becomes 2%, the excess amount was calculated and $Sn^{4+}/(Sn^{2+}+Sn^{4+})$ was found to be overestimated within a range of 5.8 to 6.0% in the stoichiometric composition. Also, when $A_2B_2O_7$ (A=Sn, B=Nb, Ta) satisfies A/B=0.98, that is, when a shortage of Sn becomes 2%, the shortage was calculated and $Sn^{4+}/(Sn^{2+}+Sn^{4+})$ was found to be underestimated in a range of 6.7 to 7.8% in the stoichiometric composition. Therefore, even if A/B in $A_2B_2O_7$ (A=Sn, B=Nb, Ta) deviates from the stoichiometric composition by about 2%, an influence on $Sn^{4+}$ is considered to be at most 8% or less in percentage as long as $A_2B_2O_7$ has a pyrochlore structure. This leads to obtaining almost the same effects as those of the stoichiometric composition, that is, those of A/B=1.

Thus, $A_2B_2O_7$ (A=Sn, B=Nb, Ta) in a general chemical formula exhibits p-type conduction in 0.124 $Sn^{4+}/(Sn^{2+}+Sn^{4+})$ 0.148 even if Sn/(Nb+Ta) deviates from the stoichiometric composition by 1 to about ±2%, that is, as long as Sn/(Nb+Ta) is within a range of 1±0.02. Incidentally, Sn in Sn/(Nb+Ta) is used as a meaning of $(Sn^{2+}+Sn^{4+})$.

Second Embodiment

Explained in the present embodiment will be a case of the oxide composite of the first embodiment to which a trace of element other than Sn, Ta, and Nb is added. Even if the trace of elements is added, the added oxide composite exhibits p-type semiconductor characteristics similarly to those of the first embodiment when its crystal structure is a pyrochlore structure.

[Production of Oxide Composite With Crystal Structure that Includes Pyrochlore Structure Elementally Containing Sn, Containing One or More of Nb or Ta, and Having Other Elements as Additive Elements]

Similarly to the production of the oxide composite in the first embodiment, SnO powder (High purity Materials KOJUNDO CHEMICAL LABORATORY CO. LTD, 99.5% purity) and $Ta_2O_5$ powder (High purity Materials KOJUNDO CHEMICAL LABORATORY CO. LTD, 99.9% purity) were weighed; any one of $V_2O_5$ (High purity Materials KOJUNDO CHEMICAL LABORATORY CO. LTD, 99.9% purity) of 3 atom %, $WO_2$ powder (Wako Pure Chemical Corporation, 99.9% purity) of 3 atom %, and $Mn_2O_3$ (High purity Materials KOJUNDO CHEMICAL LABORATORY CO. LTD, 99.9% purity) of 3 atom % was added to the weighed powders; and the added powders were placed in a mortar made of agate and were wet-mixed for about 1 hour while ethanol (Wako Pure Chemical Corporation, special grade) was added thereto.

Thereafter, the mixture was left overnight at room temperature to dry the ethanol, and was divided into 6 powder groups approximately equal to one another. Each power group was uniaxially pressurized (15 mm in diameter, 170 MPa) to produce six disk-shaped green compacts. The green compacts were placed on an alumina boat, put in an electric furnace having an alumina core tube whose diameter is 50 mm and whose length is 800 mm, and were temporarily calcined at 1173 K for 4 hours while nitrogen gas was caused to flow therein at a flow rate of 150 ml/minute. The temporarily calcined green compacts were crushed in the agate mortar, were mixed with ethanol after addition of a polyvinyl alcohol aqueous solution as a binder to a sample by 2 wt.%, and were left overnight at room temperature for drying. Then, the dried samples were sifted so that each of their particle size is adjusted to 212 μm or less, and were subjected to hydrostatic molding (285 MPa) after their uniaxially pressurization (15 mm in diameter, 170 MPa). Consequently, compacts each having a diameter of about 15 mm and a thickness of about 1.2 mm were produced. The obtained compacts were placed on an alumina boat, and were subjected to main calcination at 1023 K for 4 hours while nitrogen gas is caused flow (flow rate: 50 ml/min).

[Additive Elements and Electric Characteristics]

Table 3 collectively shows electric measurement results (specific resistance, concentration of charge carriers, mobility, and Seebeck coefficient) about samples in each of which 3 atom % of each of $V_2O_3$, $WO_2$, and $Mn_2O_3$ is added as an additive compound.

TABLE 3

| | | Measurement Results | | | |
|---|---|---|---|---|---|
| Sample Nos. | Additive Amount | Specific Resistance (Ω cm) | Concentration of Charge Carriers (cm$^{-3}$) | Mobility (cm$^2$V$^{-1}$s$^{-1}$) | Seebeck Coefficients (VK$^{-1}$) |
| 10 | V$_2$O$_3$ | 2.8 × 10$^2$ | 6.0 × 10$^{17}$ | 4.1 × 10$^{-2}$ | +4.6 × 10$^{-6}$ |
| 11 | WO$_2$ | 2.3 × 10$^1$ | 3.5 × 10$^{18}$ | 8.1 × 10$^{-2}$ | +3.6 × 10$^{-6}$ |
| 12 | Mn$_2$O$_3$ | 3.0 × 10$^2$ | 3.1 × 10$^{17}$ | 6.7 × 10$^{-2}$ | +4.5 × 10$^{-6}$ |

In Table 3, Sn$_2$Ta$_2$O$_7$, to which 3.0 atom % of each of V$_2$O$_3$, WO$_2$, and Mn$_2$O$_3$ was added, was found to be p-type semiconductor since its Seebeck coefficient took a positive value in each sample. Further, in each sample of the sample numbers 10-12 in which each additive element was 3 atom %, only a peak due to Sn$_2$Ta$_2$O$_7$ was observed from X-ray diffraction measurements, and a different phase due to an additive compound was not observed.

[Additive Amount and Electric Characteristics of Additive Element]

Explained will be an example of examining an additive amount of additive elements. Its production process was performed in the same manner as the production process of the above-mentioned oxide composite except that the above-described Ta$_2$O$_5$ powder was replaced by the Nb$_2$O$_5$ powder and that the additive compound was changed to various additive amounts of WO$_2$ powder. That is, similarly to the production process of the oxide complex in the first embodiment, SnO powder (High purity Materials KOJUNDO CHEMICAL LABORATORY CO. LTD, 99.5% purity) and Nb$_2$O$_5$ powder (High purity Materials KOJUNDO CHEMICAL LABORATORY CO. LTD, 99.9% purity) were weighed; WO$_2$ powder (Wako Pure Chemical Corporation, special grade) of 1.5 to 10 atom % was added to the weighed powders; and the added powders were placed in a mortar made of agate and were wet-mixed for about 1 hour while ethanol (Wako Pure Chemical Corporation, special grade) was added thereto. Thereafter, the oxide composite was produced by using almost the same steps as those of the above-mentioned production method.

Table 4 collectively shows electric measurement results (specific resistance, concentration of charge carriers, mobility, Seebeck coefficient) of a sample to which WO$_2$ is added as an additive compound and in which an additive amount to be added is 0.5 to 10 atomic %.

TABLE 4

| | | Measurement Results | | | |
|---|---|---|---|---|---|
| Sample Nos. | Additive Amount (atm %) | Specific Resistance (Ω cm) | Concentration of Charge Carriers (cm$^{-3}$) | Mobility (cm$^2$V$^{-1}$s$^{-1}$) | Seebeck Coefficients (VK$^{-1}$) |
| 13 | 0.5 | 6.5 × 10$^1$ | 5.3 × 10$^{17}$ | 2.4 × 10$^{-1}$ | +8.8 × 10$^{-6}$ |
| 14 | 1.5 | 3.4 × 10$^1$ | 1.7 × 10$^{18}$ | 1.1 × 10$^{-1}$ | +8.8 × 10$^{-6}$ |
| 15 | 5 | 1.9 × 10$^1$ | 4.1 × 10$^{18}$ | 9.0 × 10$^{-2}$ | +9.0 × 10$^{-6}$ |
| 16 | 10 | 3.3 × 10$^1$ | 3.2 × 10$^{18}$ | 6.0 × 10$^{-2}$ | +6.3 × 10$^{-6}$ |

In Table 4, Sn$_2$Nb$_2$O$_7$, to which 1.5 to 10 atom % of WO$_2$ were added, was found to be p-type semiconductor since its Seebeck coefficient took a positive value in each sample. Further, in each of the samples of sample numbers 13-16 in which each additive element is 0.5 to 10 atm %, a peak due to Sn$_2$Ta$_2$O$_7$ was observed from X-ray diffraction measurements in any case. It is understood from this that preferable characteristics are obtained when the additive element is 10 atom % or less. Additionally, some different phases due to W are slightly observed in the samples (sample numbers 15-16) in which the additive elements are 5 atm % and 10 atm %, but no different phases are observed in the samples (sample numbers 13-14) in which the additive elements are 0.5 atm % and 1.5 atm %. Understood from this is that more preferable characteristics are obtained when the additive element is 3 atom % or less. However, if the additive element is 10 atm % or less, the p-type semiconductor is found to be realizable even when any different phases due to the additive element are slightly observed.

Although each concrete example of V, W, and Mn has been shown as an additive element, their respective ion radii are 0.064 nm (V$^{3+}$), 0.066 nm (W$^{4+}$), 0.065 nm (Mn$^{3+}$), and are smaller 0% (V$^{3+}$), 3.1% (W$^{4+}$), and 1.6% (Mn$^{3+}$) in difference than ion radii (both 0.064 nm) of Nb$^{5+}$ and Ta$^{5+}$. Generally, it is said that a difference in size between an ion to be substituted and an ion of an additive element is within 15% to form a substitution type solid solution. Therefore, ion radii of Zr, V, Ga, Hf and Mo are also 0.072 nm (12.5% in difference), 0.061 nm (4.7% in difference), 0.062 nm (3.1% in difference), 0.071 nm (10.9% in difference), and 0.065 nm (1.6% in difference), respectively. As with V, W, and Mn, since the difference therebetween is within 15%, the substitution type solid solution can be formed to a pyrochlore structure. Additionally, any of the structural defects are also considered as defects which generate holes, so that the p-type can be realized even when an almost equal amount of additive elements is added.

As described above, from the identification of the crystal phase by the X-ray diffraction, the evaluations of the electric characteristics by the Hall effect measurement and thermoelectric characteristic measurement, and the results of Sn$^{4+}$/(Sn$^{2+}$+Sn$^{4+}$) by the Mossbauer spectrum measurement, a compound represented by Sn$_2$Nb$_{2-x}$Ta$_x$O$_7$ in a general chemical formula demonstrably has the crystal structure including the pyrochlore structure and expresses the p-type semiconductor characteristics using holes as charge carries when the ratio Sn$^{4+}$/(Sn$^{2+}$+Sn$^{4+}$) of Sn$^{4+}$ to the total amount of Sn in a substance is 0.124≤Sn$^{4+}$/(Sn$^{2+}$+Sn$^{4+}$)≤0.148. Further, the oxide semiconductor of the present invention can demonstrably realize the p-type oxide semiconductor even when having, as an additive element, at least one or more kinds of elements selected from a group composed of W, Zr, V, Mn, Ti, Ga, Hf, and Mo. The p-type oxide semiconductor can be realized even when the amount of the additive elements is 0.001 atom % or more and 10 atom % or less. Additionally, the total amount of the additive elements is preferably 0.001 atom % or more and 10 atom % or less, more preferably 0.001 atom % or more and 3 atom % or less.

Although a case of the bulk-like composite is exemplified by a producing method of the above-mentioned oxide composite, almost the same p-type characteristics are acquired also in thin film form. Thin-film oxide semiconductors can be produced by oxide thin-film producing techniques such as a spin coating method and a spray coating method that use a solution as a starting material in addition to vacuum deposition techniques such as a sputtering method, an evaporation method by heating or electron beams, and an ion plating method.

Further, for example, a semiconductor device including the oxide semiconductor of the present invention can vary a band gap of the oxide semiconductor by its composition. Use of such a variable band gap makes it possible to realize a device capable of effectively using light in all of areas where the band gap is in a range of 2.3 to 3.0 eV if a solar cell has a structure in which a pn junction element made of an oxide semiconductor having the largest (widest) band gap is formed on a light-emitting uppermost surface and in which pn-junction elements each made of an oxide semiconductor having a smaller band gap are multilayer-arranged.

Incidentally, the examples shown in the above-described embodiments etc. are described to make the invention easily understood, and so the present invention is not limited to such embodiments.

Since the oxide semiconductor of the present invention can realize the p-type semiconductor, the pn junction can be realized by the transparent n-type and p-type semiconductors in the visible light region, is widely usable in devices such as transmissive type displays and transparent transistors, and is industrially useful.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A p-type oxide semiconductor comprising:
    a composite oxide having a crystal structure, containing at least one or more kinds of elements selected from Nb and Ta, and containing Sn element, the crystal structure including a pyrochlore structure, wherein $Sn^{4+}/(Sn^{2+}+Sn^{4+})$, which is a ratio of $Sn^{4+}$ to a total amount of Sn in the composite oxide, is $0.13 \leq Sn^{4+}/(Sn^{2+}+Sn^{4+})$ 0.148.

2. The p-type oxide semiconductor according to claim 1, wherein the composite oxide represented by $Sn_2Nb_2O_7$ or $Sn_2Ta_2O_7$.

3. The p-type oxide semiconductor according to claim 1, wherein at least one or more elements selected from a group consisting of W, Zr, V, Mn, Ti, Ga, Hf, and Mo is added as an additive element.

4. The p-type oxide semiconductor according to claim 3, wherein the additive element is 0.001 atm % or more and 10 atom % or less in total of an additive element.

5. The p-type oxide semiconductor according to claim 1, wherein Sn/(Nb+Ta) is in a range of 1±0.02.

6. A semiconductor device including the p-type oxide semiconductor according to claim 1.

7. The p-type oxide semiconductor according to claim 2, wherein at least one or more elements selected from a group consisting of W, Zr, V, Mn, Ti, Ga, Hf, and Mo is added as an additive element.

8. The p-type oxide semiconductor according to claim 2, wherein Sn/(Nb+Ta) is in a range of 1±0.02.

9. The p-type oxide semiconductor according to claim 3, wherein Sn/(Nb+Ta) is in a range of 1±0.02.

10. The p-type oxide semiconductor according to claim 4, wherein Sn/(Nb+Ta) is in a range of 1±0.02.

11. The p-type oxide semiconductor according to claim 7, wherein Sn /(Nb+Ta) is in a range of 1±0.02.

12. A semiconductor device including the p-type oxide semiconductor according to claim 2.

13. A semiconductor device including the p-type oxide semiconductor according to claim 3.

14. A semiconductor device including the p-type oxide semiconductor according to claim 4.

15. A semiconductor device including the p-type oxide semiconductor according to claim 5.

16. A semiconductor device including the p-type oxide semiconductor according to claim 7.

17. A semiconductor device including the p-type oxide semiconductor according to claim 8.

18. A semiconductor device including the p-type oxide semiconductor according to claim 9.

19. A semiconductor device including the p-type oxide semiconductor according to claim 10.

20. A semiconductor device including the p-type oxide semiconductor according to claim 11.

* * * * *